United States Patent [19]
Cannella

[11] 4,205,782
[45] Jun. 3, 1980

[54] REMOTE THERMOSTAT HEATER AND METHOD OF CONTROL THEREFOR

[75] Inventor: Joseph L. Cannella, Arlington Heights, Ill.

[73] Assignee: Candel, Inc., Arlington Heights, Ill.

[21] Appl. No.: 968,190

[22] Filed: Dec. 11, 1978

[51] Int. Cl.² .................. H03K 17/60; F23N 5/20
[52] U.S. Cl. ......................... 236/46 R; 236/68 B; 307/252 B
[58] Field of Search .............. 236/68 B, 51, 46 R; 307/324, 252 B; 337/377; 219/511; 165/22, 12

[56] References Cited

U.S. PATENT DOCUMENTS

| | | | |
|---|---|---|---|
| 3,763,396 | 10/1973 | Shilling | 307/252 B |
| 3,855,482 | 12/1974 | Wills | 307/252 B |
| 3,896,369 | 7/1975 | Nakata | 307/252 B |
| 3,972,471 | 8/1976 | Ziegler | 236/46 R |
| 4,032,069 | 6/1977 | Cannella | 236/46 R |

OTHER PUBLICATIONS

Using the Triac for Control of AC Power, J. H. Galloway, 06/1976, pp. 2, 3, 7, 8, 10 & 13, cover page.

Primary Examiner—William E. Wayner
Attorney, Agent, or Firm—Kinzer, Plyer, Dorn & McEachran

[57] ABSTRACT

A temperature control system includes a plurality of spaced independent thermostats, each of which has a temperature sensing means and a resistive heat source positioned closely adjacent the temperature sensing means. The resistive heat sources are connected in parallel and there is a timing device and a control circuit for regulating the application of power connected between the parallel combination of the resistive heat sources and a source of power.

8 Claims, 2 Drawing Figures

REMOTE THERMOSTAT HEATER AND METHOD OF CONTROL THEREFOR

SUMMARY OF THE INVENTION

The present invention relates to temperature control systems and in particular to a means for automatically changing the effective temperature setting of a plurality of thermostats.

A primary purpose of the invention is a simply constructed reliable means for automatically adjusting the effective temperature setting of a plurality of individual separate and independent thermostats.

Another purpose is a control system of the type described including a programmable timer and a control circuit which regulates the application of power, in accordance with the timer, to a plurality of independent resistive heat sources, each associated with an independent thermostat.

Another purpose is a control system of the type described utilizing a compact and efficient semiconductor control circuit for regulating the period of conduction of each half cycle of applied power to a plurality of resistive heat sources.

Another purpose is a control circuit of the type described which utilizes a variable resistor to regulate the application of power to a group of resistive heat sources.

Another purpose is a control system of the type described in which one or more of the resistive heat sources may include a switch for temporarily disabling the heat source.

Another purpose is a control system utilizing a pair of parallel connected DIACs to provide the firing signal for a TRIAC which in turn regulates the period of conduction of the power applied to each of the resistive heat sources.

Other purposes will appear in the ensuing specification, drawings and claims.

BRIEF DESCRIPTION OF THE DRAWINGS

The invention is illustrated diagrammatically in the following drawings wherein.

DESCRIPTION OF THE PREFERRED EMBODIMENT

My prior U.S. Pat. No. 4,032,069 discloses a programmable thermostat control in which a resistive heat source is placed adjacent a conventional thermostat. Application of power to the heat source effectively changes the temperature of the air immediately adjacent the thermostat, thus conditioning the thermostat to provide an inaccurate determination of the adjacent ambient temperature. The present invention utilizes such a resistive heat source adjacent a thermostat. There is a master timer and a control circuit which regulates the application of power, as determined by the timer, to a plurality of independent resistive heat sources, each of which is positioned adjacent independent and spaced thermostats. Thus, a single timer and the control circuit used therewith are arranged to control a plurality of independent thermostats which may each regulate the temperature of a particular area building or room. Each thermostat may independently control a heating device. Thus, with a single timer and related control circuit it is possible to regulate all of the independent thermostats.

Figure 1:
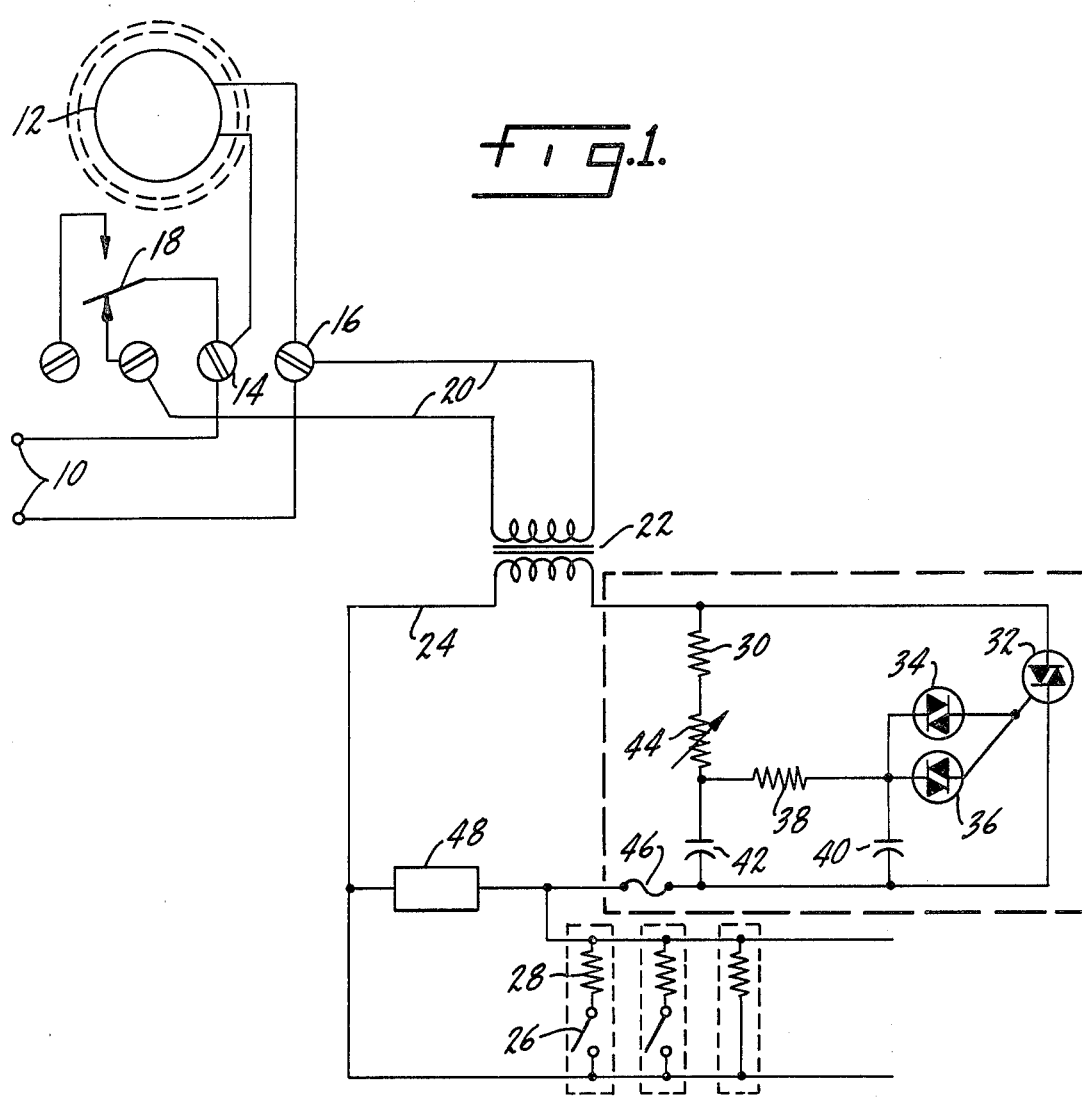
FIG. 1 is an electrical schematic of the temperature control system disclosed herein.

In FIG. 1 terminals 10 may conventionally be connected to a source of alternating current power. A seven-day 24-hour programmable timer 12 of the type manufactured by Intermetic, Inc. of Spring Grove, Ill., is connected through terminals 14 and 16 to the power source 10.

A switch is indicated diagrammatically at 18 with the operation of the switch being controlled by timer 12. When switch 18 is in the position shown, power will be supplied from source 10 through lines 20 to a transformer 22. The normal position of switch 18 will be opposite that shown in which case there will be no power supplied to transformer 22 and the thermostats connected to the control system will operate in the conventional manner.

One side 24 of the secondary of transformer 22 is connected to one side of a series of switches 26, each of which is connected in series with a resistive heat source or load resistor 28. The series combination of switches 26 and resistors 28 are positioned at each of the separate and independent thermostats as described hereinafter. The series combinations are each connected in parallel, as clearly shown in FIG. 1. It is not necessary that every resistive heat source have a switch associated with it. In fact, in many applications of the invention there may be switches at only one or a few thermostat locations.

The other side of the secondary of transformer 22 is connected to a resistor 30 and to a TRIAC 32. The firing signal for TRIAC 32 is provided by parallel connected DIACs 34 and 36. The common input connection for the two DIACs is connected to a resistor 38 and a timing capacitor 40. A second timing capacitor 42 is connected to capacitor 40 and to a variable resistor 44. A fuse 46 and a meter 48 complete the control circuit of FIG. 1.

Figure 2:
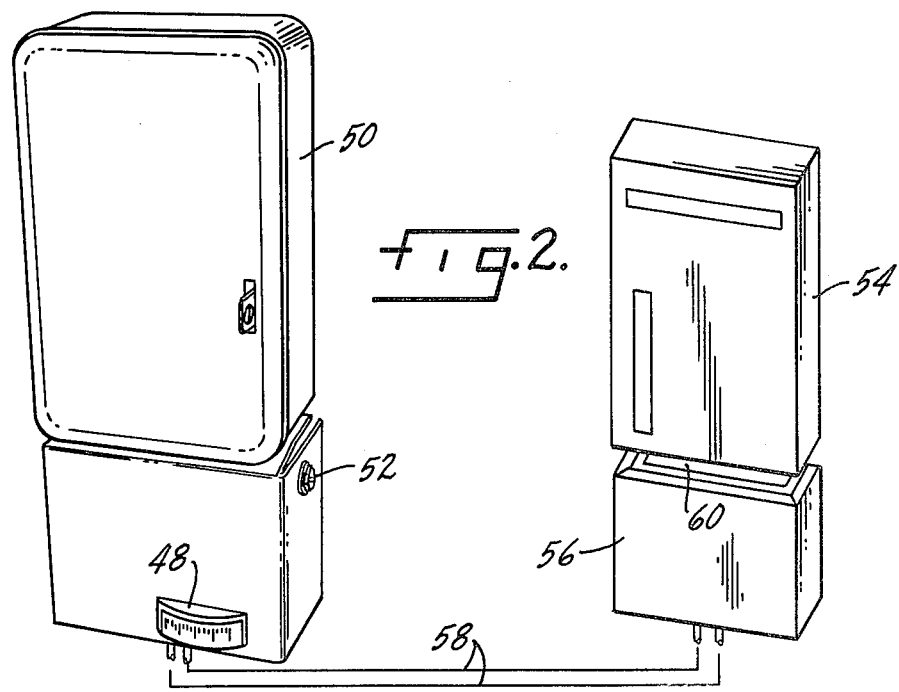
FIG. 2 is an illustration of the main control housing and thermostat and its associated heat source.

In FIG. 2 a housing 50 will conventionally be mounted on a wall at a convenient location and will enclose timer 12, transformer 22 and the control circuit described in FIG. 1. Meter 48 is positioned near the bottom of housing 50 and the external adjustment for variable resistor 44 is indicated on the side of the housing at 52.

A typical thermostat, for example of the type shown in my above-mentioned prior patent, is indicated at 54. Positioned directly beneath thermostat 54 is a housing 56 which is electrically connected, by wires 58, to the control circuit described above. Positioned within housing 56 is a resistive heat source 28 and a switch 26 if such is to be used with that particular thermostat. There is an opening 60 in the top of housing 56 so that the heat generated by the resistive heat source therein may be applied directly to adjacent thermostat 54.

In operation, timer 12 may be set for any multiple hour period for each day of the week. At such time as the timer causes the closure of switch 18, power from source 10 will be applied through transformer 22 to the resistive heat sources 28 as determined by the control circuit. The control circuit is effective to regulate the period of conduction or the period of power applied to each of the resistive heat sources during each half cycle of the applied sine wave. DIACs 34 and 36 will provide a triggering signal to TRIAC 32 and thus permit the flow of current to resistors 28 once a certain voltage level has been reached in the applied sine wave. In the circuit shown as soon as the applied sine wave reaches approximately 3–5 volts, the DIACs will conduct, thus applying a triggering signal to TRIAC 32 permitting the application of power to the load resistors.

Conventionally, DIACs do not conduct at the same voltage level in both directions. For example, TRIAC 34 may conduct at a 3–5 volt level on the positive half cycle and at a 20–28 volt level on the negative half cycle. As clearly shown in FIG. 1, the DIACs are connected in a reverse sense. That is, DIACs 34 will conduct at a 3–5 volt level on the positive half cycle. DIAC 36 is connected in the reverse direction, thus providing a conduction point of 3–5 volts on the negative half cycle. Without the application of the dual DIACs, connected in the manner shown, the periods of conduction on the negative and positive half cycles would be different, as indicated above, causing the voltage applied to the resistive heat sources to be unacceptably variable.

Capacitors 40 and 42 in combination with resistor 38 provide a double time constant to insure that the firing point for both DIACs will be the same on both the positive and negative half cycles of the applied sine wave.

Variable resistor 44 permits the firing point of the DIACs to be variable and thus the amount of power actually applied to the heat source may be easily regulated from the master control station. It may be that different environments will require different temperature changes. The thermostats, connected as shown, can be easily controlled from the master location. In this connection, meter 48 will give a direct indication of the voltage being applied to the resistive heat sources and thus may be used in operation of the control system to provide an accurate indication of the temperature drop caused by the resistive heat source.

Each of the resistive heat sources, when power is applied thereto, will provide heat directly to the adjacent thermostat. The thermostat is "fooled" into believing that ambient temperature is different than it actually is. Thus, the thermostat is effective to lower the ambient temperature in the area during the period that power is applied to each of the resistive heat sources.

Transformer 22 is advantageous, although not necessary. With the transformer in the circuit as shown only a relatively low voltage is present at the thermostat.

Whereas the preferred form of the invention has been shown and described herein, it should be realized that there may be many modifications, substitutions and alterations thereto.

The embodiments of the invention in which an exclusive property or privilege is claimed are defined as follows:

1. A temperature control system including a plurality of spaced independent thermostats each having a temperature sensing means, a resistive heat source positioned closely adjacent each temperature sensing means, a source of power, timing means, and a control circuit for regulating the application of power to said resistive heat sources, said resistive heat sources being connected in parallel with said timing means and control circuit being connected between said parallel connected resistive heat sources and the source of power, said control circuit including parallel connected DIACs for regulating the time period of power application to said parallel connected resistive heat sources during each half cycle of applied power.

2. The control system of claim 1 further characterized in that said control circuit includes a variable resistor.

3. The control system of claim 1 further characterized in that said control circuit includes a TRIAC, with said parallel connected DIACs providing the firing signal for said TRIAC.

4. The control system of claim 3 further characterized by and including a pair of timing capacitors connected to the common input of said DIACs, with the common output of said DIACs being connected to said TRIAC.

5. The control system of claim 4 further characterized by and including a resistor connected between one side of each of said capacitors and to the common DIAC input connection.

6. The control system of claim 3 further characterized in that said DIACs are connected, in reverse sense, such that one DIAC initially conducts on each positive half cycle of the applied power with the other initially conducting on each negative half cycle of the applied power and with the points of initial conduction being the same for both positive and negative half cycles of the applied power.

7. The control system of claim 1 further characterized by and including a switch connected in series with at least one resistive heat source at the heat source location.

8. The control system of claim 1 further characterized by and including an independent individual housing for each resistive heat source positioned directly and closely adjacent each temperature sensing means.

* * * * *